(12) United States Patent
Chung et al.

(10) Patent No.: US 11,160,171 B2
(45) Date of Patent: Oct. 26, 2021

(54) CIRCUIT FORMING METHOD USING SELECTIVE ETCHING OF ELECTRICALLY CONDUCTIVE METAL THIS FILM SEED LAYER AND ETCHING SOLUTION COMPOSITION

(71) Applicant: InkTec Co., Ltd., Ansan-si (KR)

(72) Inventors: Kwang-Choon Chung, Yongin-si (KR); Su Han Kim, Ansan-si (KR); Jung Yoon Moon, Ansan-si (KR); Hyeon-Jun Seong, Ansan-si (KR); Byung Woong Moon, Siheung-si (KR)

(73) Assignee: InkTee Co., Ltd., Ansan-si (KR)

( * ) Notice: Subject to any disclaimer, the term of this patent is extended or adjusted under 35 U.S.C. 154(b) by 134 days.

(21) Appl. No.: 16/485,174

(22) PCT Filed: Feb. 14, 2018

(86) PCT No.: PCT/KR2018/001938
§ 371 (c)(1),
(2) Date: Dec. 23, 2019

(87) PCT Pub. No.: WO2018/151530
PCT Pub. Date: Aug. 23, 2018

(65) Prior Publication Data
US 2020/0389979 A1 Dec. 10, 2020

(30) Foreign Application Priority Data
Feb. 14, 2017 (KR) .................. 10-2017-0020202

(51) Int. Cl.
*H05K 3/06* (2006.01)
*C09K 13/06* (2006.01)
*C23F 1/30* (2006.01)

(52) U.S. Cl.
CPC ............. *H05K 3/067* (2013.01); *C09K 13/06* (2013.01); *C23F 1/30* (2013.01); *H05K 2203/0703* (2013.01)

(58) Field of Classification Search
CPC ........... H05K 3/067; H05K 2203/0703; C09K 13/06; C23F 1/30
See application file for complete search history.

(56) References Cited

U.S. PATENT DOCUMENTS

| | | | |
|---|---|---|---|
| 8,821,753 B2* | 9/2014 | Chung | .................. C09K 13/06 252/79.1 |
| 2003/0168431 A1* | 9/2003 | Lee | .......................... C23F 1/30 216/86 |

(Continued)

FOREIGN PATENT DOCUMENTS

| | | |
|---|---|---|
| KR | 10-0279323 | 2/2001 |
| KR | 10-0712879 | 4/2007 |

(Continued)

OTHER PUBLICATIONS

Wikipedia, The Free Encyclopedia, "Sodium peroxide" via https://web.archive.org/web/20150507010632/https://en.wikipedia.org/wiki/Sodium_peroxide ; pp. 1-5 (Year: 2015).*

(Continued)

*Primary Examiner* — Binh X Tran

(57) ABSTRACT

The present invention relates to an etching solution composition for selectively etching only silver, a silver alloy, or a silver compound, and to a circuit forming method using the composition. The circuit forming method according to the present invention is characterized in that, in a substrate material in which an electrically conductive seed layer and a circuit layer are formed of heterogeneous metals, only the seed layer is selectively etched to enable the implementation of fine pitches. In addition, the present invention relates to a circuit forming method and an etching solution composi- (Continued)

Figure 2:
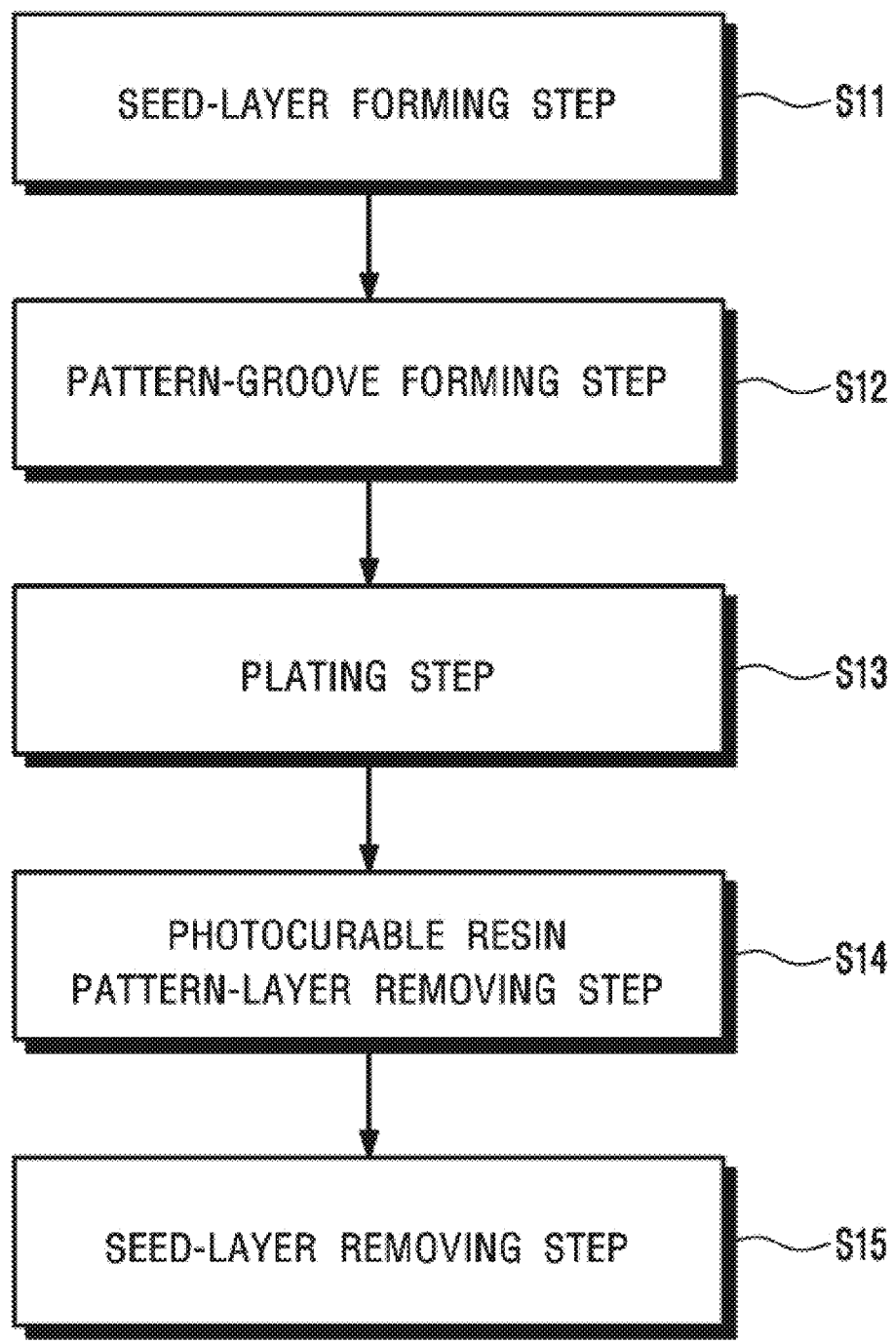

tion, wherein only a seed layer of silver (Ag), a silver alloy, or a silver compound is selectively etched without etching a copper (Cu) plated circuit.

4 Claims, 7 Drawing Sheets

(56) References Cited

U.S. PATENT DOCUMENTS

| | | | | |
|---|---|---|---|---|
| 2008/0277381 | A1* | 11/2008 | Chung | C23F 1/14 |
| | | | | 216/94 |
| 2016/0192503 | A1* | 6/2016 | Iwata | C04B 41/91 |
| | | | | 29/847 |
| 2018/0298500 | A1* | 10/2018 | Takahashi | C23F 1/18 |
| 2020/0221578 | A1* | 7/2020 | Chung | H05K 1/115 |

FOREIGN PATENT DOCUMENTS

| | | |
|---|---|---|
| KR | 10-2009-0081566 | 7/2009 |
| KR | 10-1044790 | 6/2011 |
| KR | 10-2011-0088971 | 8/2011 |
| KR | 10-1247303 | 3/2013 |
| KR | 10-2013-0130515 | 12/2013 |
| KR | 10-2015-0018213 | 2/2015 |
| WO | WO-2016080383 A1 * | 5/2016 ............... C23F 1/18 |
| WO | WO 2018/151530 | 8/2018 |

OTHER PUBLICATIONS

Wikipedia, The Free Encyclopedia, "Peroxybenzoic acid" via https://web.archive.org/web/20200313013641/https://en.wikipedia.org/wiki/Peroxybenzoic_acid ; pp. 1-3 (Year: 2020).*
Wikipedia, The Free Encyclopedia, "meta-Chloroperoxybenzoic acid" via https://web.archive.org/web/20161126164231if_/https://en.wikipedia.org/wiki/Meta-Chloroperoxybenzoic_acid ; pp. 1-3 (Year: 2016).*
Grounds of Reasons of Rejection Dated Dec. 2, 2019 From the Korean Intellectual Property Office Re. Application No. 10-2018-0018264 and Its Summary in English. (5 Pages).
Grounds of Reasons of Rejection dated May 29, 2019 From the Korean Intellectual Property Office Re. Application No. 10-2018-0018264. (6 Pages).
International Search Report and the Written Opinion dated Jun. 7, 2018 From the International Searching Authority Re. Application No. PCT/KR2018/001938 and Its Translation of Search Report Into English. (10 Pages).
Decision of Examination and Search Report dated Jun. 8, 2021 From the Intellectual Property Office, Ministry of Economic Affairs of the Republic of Taiwan, R.O.C. Re. Application No. 107105515 and Its Translation of Search Report Into English. (10 Pages).

* cited by examiner

Fig. 1

| | ICP (ppm) | |
|---|---|---|
| | Ag | Cu |
| SELECTIVE ETCHING SOLUTION COMPOSITION 1 | 177.4 | N.D |
| SELECTIVE ETCHING SOLUTION COMPOSITION 2 | 173.5 | N.D |
| SELECTIVE ETCHING SOLUTION COMPOSITION 3 | 176.1 | N.D |
| COMPARATIVE EXAMPLE 1 | 147.2 | 524.0 |
| COMPARATIVE EXAMPLE 2 | 139.5 | 255.4 |
| COMPARATIVE EXAMPLE 3 | 171.3 | 2,437 |

CIRCUIT FORMING METHOD USING SELECTIVE ETCHING OF ELECTRICALLY CONDUCTIVE METAL THIS FILM SEED LAYER AND ETCHING SOLUTION COMPOSITION

RELATED APPLICATIONS

This application is a National Phase of PCT Patent Application No. PCT/KR2018/001938 having International filing date of Feb. 14, 2018, which claims the benefit of priority of Korean Patent Application No. 10-2017-0020202 filed on Feb. 14, 2017. The contents of the above applications are all incorporated by reference as if fully set forth herein in their entirety.

FIELD AND BACKGROUND OF THE INVENTION

The present invention relates to an etching solution composition for selectively etching only silver (Ag), a silver alloy or a silver compound from a substrate material stacked with silver, a silver alloy or a silver compound by sputtering, chemical vapor deposition (CVD), electroless plating, coating, dipping and the like process. Further, the present invention relates to a method of using the same to form a circuit with a fine pattern.

As the information age comes, an electronics market has grown on a large scale and thus a market for ab electronic circuit is also growing rapidly. With development of technology, a high-performance and highly-integrated circuit has been increasingly required on the markets. As smart devices have come into wide use all over the world after a smartphone revolution, products have necessarily become lightweight, thin, short and compact. Therefore, there is a need of achieving a fine pitch to manufacture the products in response to such market demands.

As a conventional method of forming a circuit, a lithography process, in which a photocurable resin is used in exposure and etching to form a pattern, has mostly been used. The lithography process refers to a method of manufacturing a copper circuit board by forming a desired pattern with the photocurable resin on a substrate material having a copper plating layer and applying the exposure and the etching. However, the minimum pitch achievable by such a lithography process is 35 μm, and it is therefore difficult to form a fine pattern.

Due to such difficulty on the process, a semi additive process (SAP) method has recently been used as a technique for achieving the fine pitch. By sputtering, chemical vapor deposition (CVD), electroless plating and compression, a pattern is formed with the photocurable resin on the substrate material onto which a metal seed layer is thinly applied, and the photocurable resin is removed after a pattern groove formed as above is plated with a conductive material such as copper, etc. After the circuit is formed based on copper plating and then the photocurable resin is removed, the metal seed layer is removed, thereby forming a circuit having a fine pitch.

However, a copper-foil stacked substrate, to which the SAP method is applicable, is capable of achieving a fine pitch, but has a poor adhesive property because the seed layer is formed on a film unlike the existing two-layered and three-layered copper-foil stacked substrates. Further, the seed layer is made of copper; or metal such as chrome (Cr), nickel (NI), etc. a metal alloy or a metal compound to be etched along with copper, and therefore a circuit forming portion made of copper is also etched together with the seed layer while the seed layer is etched after removing the photocurable resin, thereby causing a nonuniform thickness and a nonuniform linewidth (see FIG. 3). Besides, when the seed layer is not completely removed, it leads to a defective product because of migration.

In addition, a plasma process or a method of using an etching solution has been hitherto used as the most common method of etching a metal wiring or thin film. In the case of using the etching solution, the etching solution generally contains phosphoric acid, nitric acid, acetic acid, hydrochloric acid, sulfuric acid, ammonia, iron phosphate, iron nitrate, iron sulfate, iron hydrochloride, sodium chlorate, and water, and therefore etches not only silver but also other metals, a metal alloy or a metal compound, thereby damaging a metal circuit layer. Thus, there has been a problem of forming a poor pattern of which an etch factor is low.

SUMMARY OF THE INVENTION

Accordingly, the present invention is conceived to solve such conventional problems, and an aspect of the present invention is to provide a method of forming a circuit, in which a pattern is formed by a semi additive process (SAP) method using a substrate material with a thin seed layer formed through sputtering, chemical vapor deposition (CVD), electroless plating, coating, dipping, and the like process employing silver excellent in electric conductivity, a silver alloy or a silver compound instead of copper, and then only silver, the a silver alloy or the silver compound is selectively etched to form the circuit.

Further, an aspect of the present invention is to provide an etching solution composition, with which only silver, a silver alloy or a silver compound is selectively etched minimizing removal of a metal circuit layer, thereby having a high etch factor and preventing a metal circuit layer from damage.

The foregoing aspects of the present invention are achieved by providing a method of forming a circuit by selectively etching an electrically conductive metal thin film seed layer, the method including: a step (S11) of forming a seed layer with silver, a silver alloy or a silver compound on a substrate material by processes including sputtering, chemical vapor deposition (CVD), electroless plating, coating, and dipping; a step (S12) of forming a pattern groove with a photocurable resin on the seed layer; a step (S13) of forming a circuit by plating the pattern groove with copper by electroplating or electroless plating; a step (S14) of exposing the seed layer by removing the photocurable resin; and a step (S15) of removing the exposed seed layer by a selective etching solution for selectively etching silver, a silver alloy or a silver compound.

The foregoing aspects of the present invention are achieved by providing a selective etching solution composition for selectively etching silver, a silver alloy or a silver compound, the selective etching solution composition including an oxidizing agent; amines or an ammonium compound; an additive; and water.

According to the present invention, there is provided a method of forming a circuit with a fine pitch by selectively etching only silver, a silver alloy or a silver compound from a heterogeneous metal substrate material including silver, a silver alloy or a silver compound and copper.

Further, according to the present invention, there is provided an etching solution composition having a high etch factor so that silver, a silver alloy or a silver compound can be selectively etched without damaging a copper circuit.

These make it possible to design a high-performance and highly-integrated circuit, and the circuit is variously applicable to a product required to be lightweight, thin, short and compact.

BRIEF DESCRIPTION OF THE SEVERAL VIEW OF THE DRAWINGS

Figure 3:
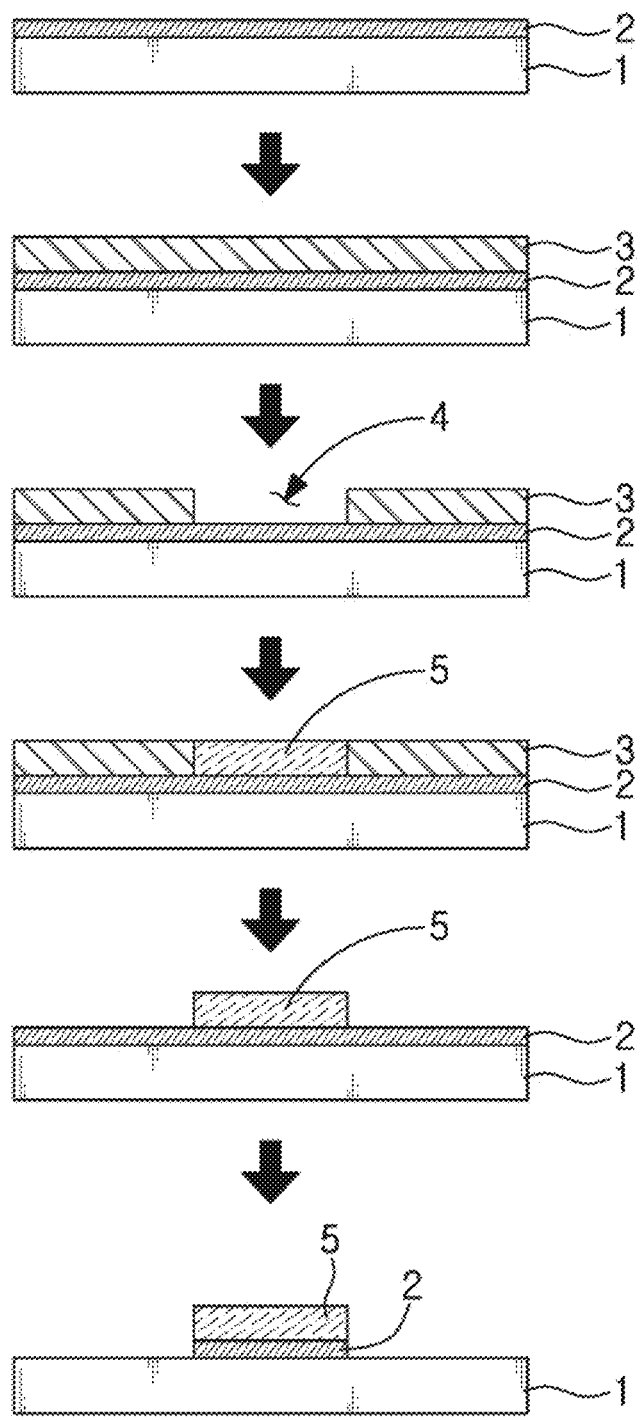
Figure 4:
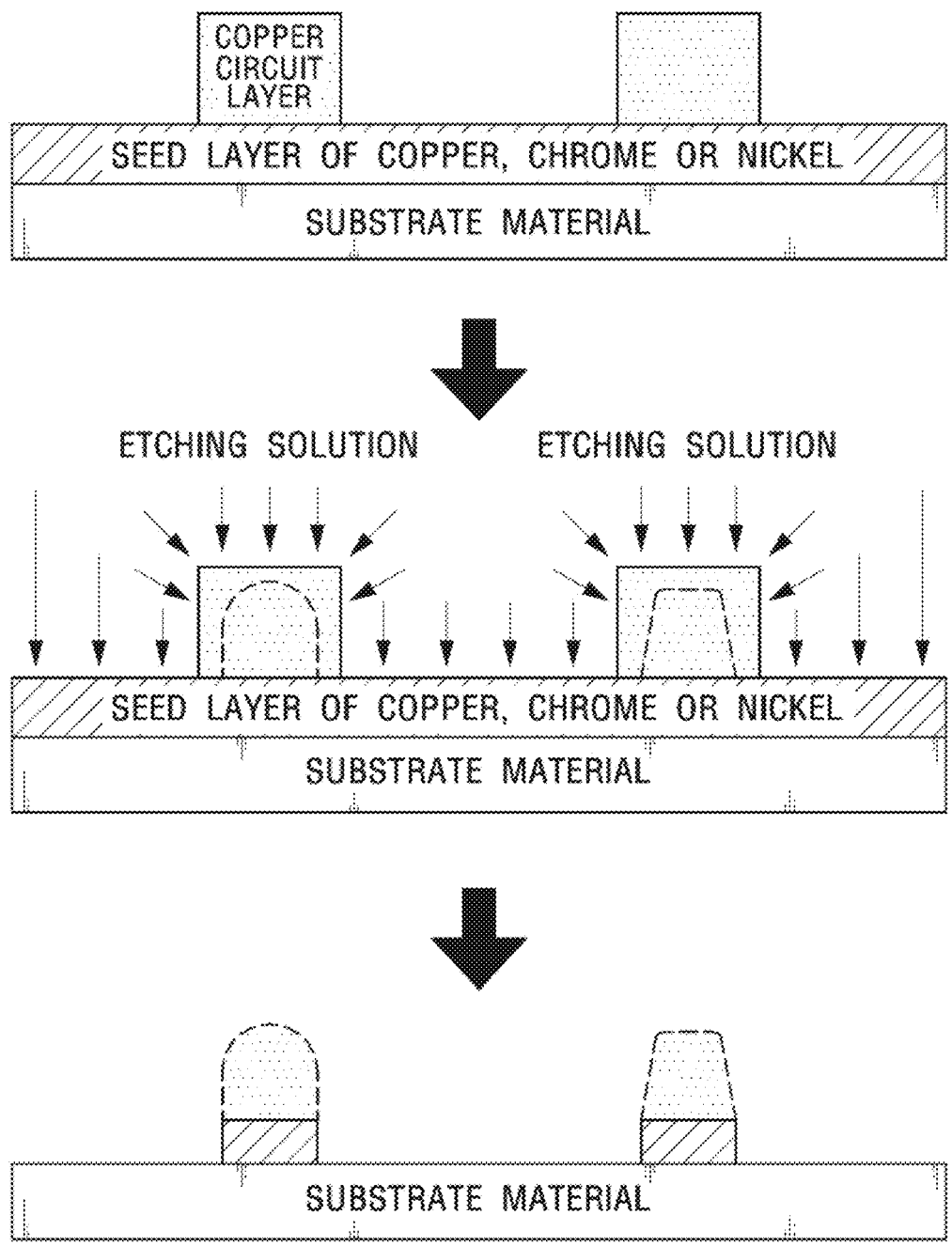
Figure 5:
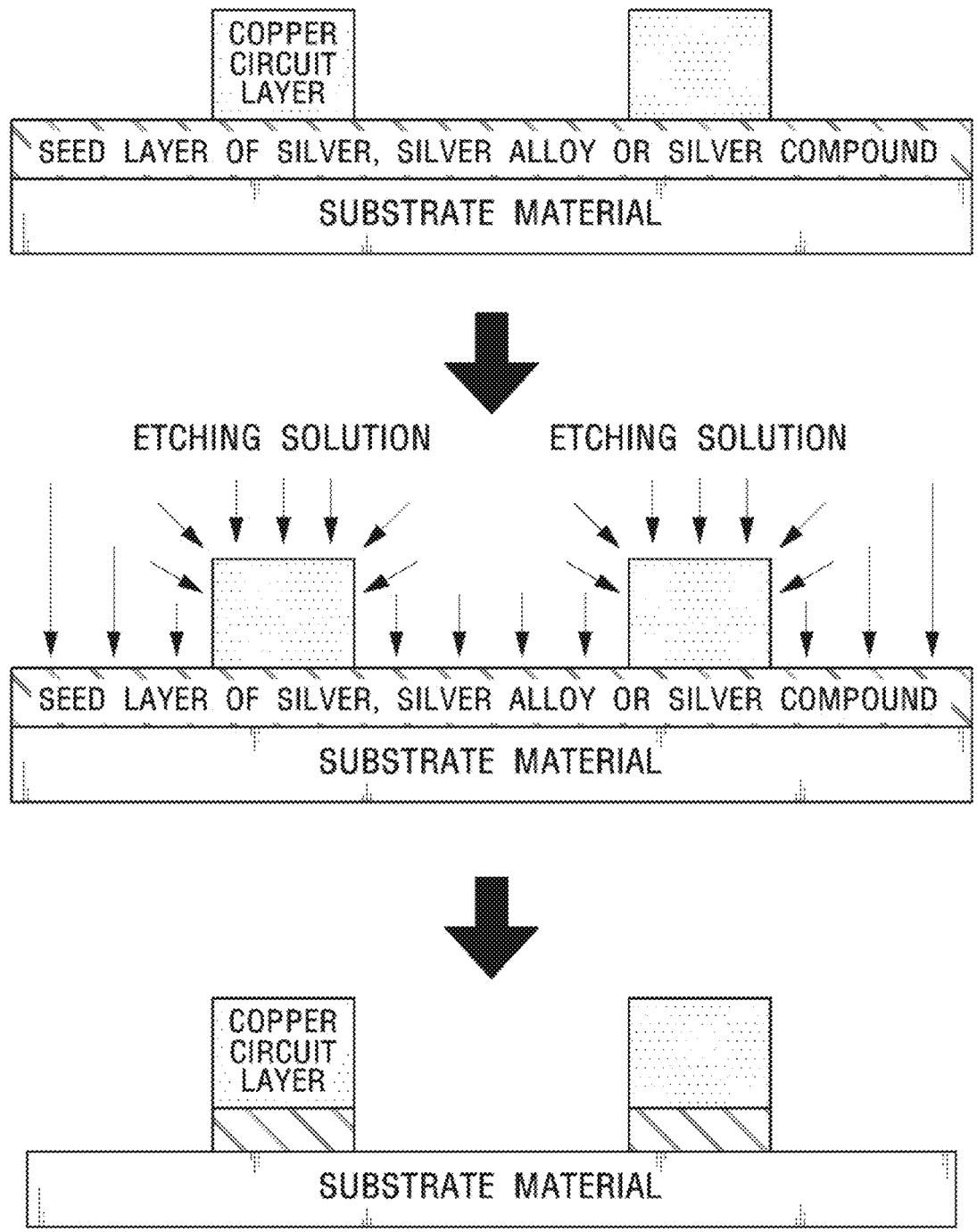
Figure 6:
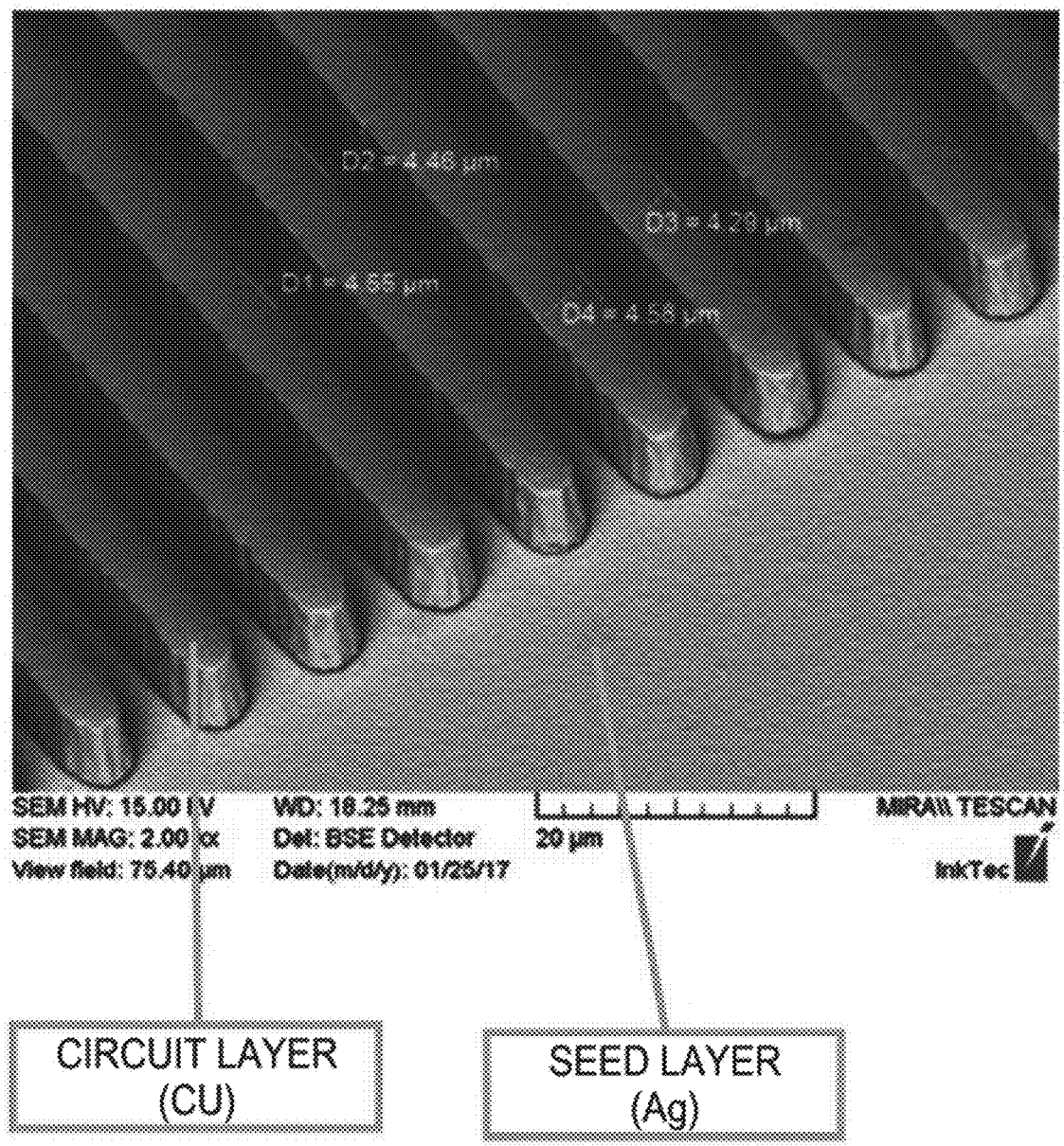
Figure 7:
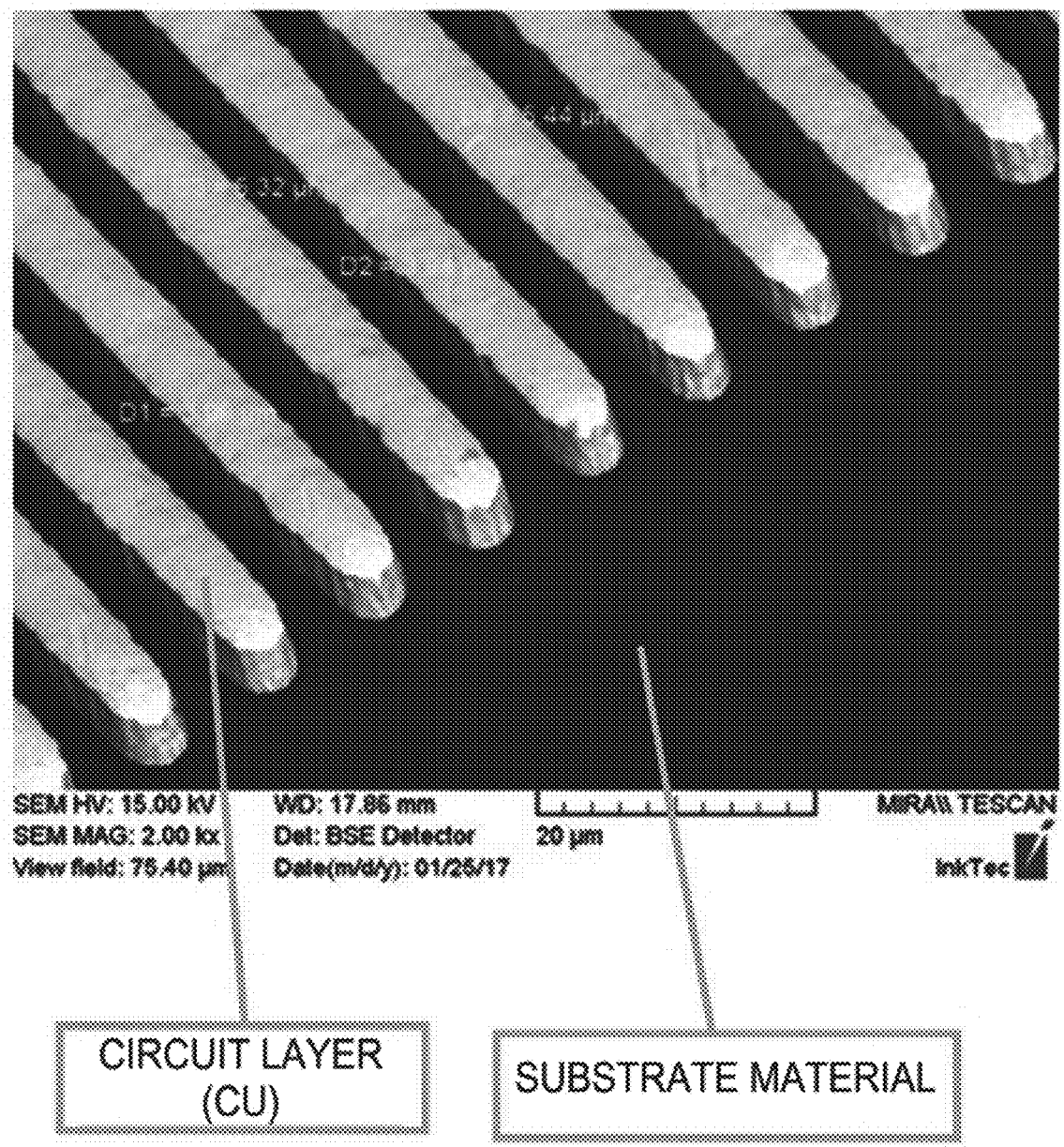

FIG. 1 illustrates etching test results of an embodiment 3;
FIG. 2 is a flowchart showing a method of forming a circuit according to the present invention;
FIG. 3 is a schematic view showing a method of forming a circuit according to the present invention;
FIG. 4 is a schematic view showing a method of forming a circuit based on a conventional substrate material and a conventional etching solution composition;
FIG. 5 is a schematic view showing a method of forming a circuit based on an etching solution composition according to the present invention;
FIG. 6 is a scanning electron microscopy (SEM) picture showing a circuit formed by removing a photocurable resin after a conductive material is filled by a method of forming a circuit according to the present invention; and
FIG. 7 is an SEM picture showing a circuit formed by selectively etching only a seed layer of silver with an etching solution composition according to the present invention.

DESCRIPTION OF SPECIFIC EMBODIMENTS OF THE INVENTION

Hereinafter, embodiments of the present invention will be described in more detail. However, the embodiments are merely examples of the present invention, and do not limit the scope of the present invention.

Embodiment 1: Preparation of Selective Etching Solution Composition 1-1: Preparation of Selective Etching Solution Composition 1

Hydrogen peroxide 12 wt %, monoethanolamine 40 wt %, wetting agent 1 wt %, antifoaming agent 1 wt %, and deionized (DI) water 46 wt % were mixed to prepare a selective etching solution composition 1.

1-2: Preparation of Selective Etching Solution Composition 2

Sodium percarbonate 7 wt %, N-methyldiethnaolamine 32.5 wt %, wetting agent 0.5 wt %, antifoaming agent 1 wt %, and DI water 59 wt % were mixed to prepare a selective etching solution composition 2.

1-3: Preparation of Selective Etching Solution Composition 3

Sodium percarbonate 4 wt %, N-methyldiethnaolamine 60 wt %, wetting agent 1.5 wt %, antifoaming agent 0.5 wt %, and DI water 34 wt % were mixed to prepare a selective etching solution composition 3.

Embodiment 2: Preparation of Comparative Examples 2-1: Preparation of Comparative Example 1

For comparison with the selective etching solution compositions 1 to 3 prepared in the embodiment 1, with reference to the embodiment 1 disclosed in Korean Patent Publication No. 10-2016-0115189, iron (III) 10 wt %, nitric acid 5 wt %, acetic acid 5 wt %, EDTA 1 wt %, glycolic acid 1 wt %, and DI water 78 wt % were mixed to prepare a comparative example 1.

2-2: Preparation of Comparative Example 2

For comparison with the selective etching solution compositions 1 to 3 prepared in the embodiment 1, with reference to the embodiment 1 disclosed in Korean Patent Publication No. 10-2010-0098409호, ammonia 7 wt %, hydrogen peroxide 1.5 wt %, and DI water 91.5 wt % were mixed to prepare a comparative example 2.

2-3: Preparation of Comparative Example 3

For comparison with the selective etching solution compositions 1 to 3 prepared in the embodiment 1, with reference to the comparative embodiment 2 disclosed in Korean Patent Publication No. 10-2010-0098409, phosphoric acid 50 wt %, nitric acid 5 wt %, acetic acid 30 wt %, and DI water 15 wt % were mixed to prepare a comparative example 3.

Embodiment 3: Etching Test Results

Under test conditions such as a substrate material of polyimide (PI), a specimen size of 2.5×2.5 cm (Ag coating seed layer, Cu-flexible copper clad laminate (FCCL)), an etching solution of 40 g, an etching time of 10 seconds, and an inductively coupled plasma (ICP) analysis of regarding less than 5 ppm as not detected (N.D), the selective etching solution composition prepared in the embodiment 1 and the comparative example prepared in the embodiment 2 were subjected to an etching test (see FIG. 1).

As a result, with the selective etching solution compositions 1 to 3 and for the etching time of 10 seconds, silver was etched to expose the surface of the PI substrate material. However, the surface of the Cu FCCL did not have any specific discoloration or anything significant, and therefore it was appreciated that the etching solution made no surface oxidation.

On the other hand, with the comparative examples 1 and 2 and for the same period of time, silver was not etched by 100% leaving a residue, and the surface of the Cu FCCL was oxidized and discolored. Further, with the comparative example 3 and for the same period of time, silver was etched by 100%, but the surface of the Cu FCCL was quickly etched and rapidly oxidized.

Silver and copper detected in the etching solution by the ICP analysis are as follows. In the comparative examples 1 and 2 with which silver was not etched by 100%, silver less than 170 ppm was detected. In the comparative examples 1 to 3 with which the surface of the Cu FCCL was oxidized and discolored, copper was detected. In particular, the comparative example 1 and 3 with which silver was much etched, copper was also quickly etched and thus much detected.

In conclusion, unlike the comparative examples 1 to 3, the selective etching solution compositions 1 to 3 made silver be etched 100%, i.e. more than 170 ppm for the etching time of 10 seconds, and copper be not detected, i.e. N.D (detected as much as less than 5 ppm). Therefore, it was understood that the selective etching solution compositions 1 to 3 selectively etched only silver.

Although detailed descriptions of the present invention are made above, it will be apparent to a person having an ordinary skill in the art that such details are merely preferred embodiments and do not limit the scope of the present invention. Therefore, the scope of the present invention is defined in the appended claims and their equivalents.

REFERENCE NUMERALS

1: substrate material
2: conductive seed layer
3: photocurable resin
4: pattern groove
5: conductive material

MODES FOR CARRYING OUT THE INVENTION

Unless otherwise defined, all technical and scientific terms used in the present invention have the same meaning as typically understood by those skilled in the art to which the present invention pertains. In general, the nomenclature employed in the present invention is well known to and generally used in this technical field.

Descriptions about specific structures or functions proposed in an embodiment of the present invention are given for illustrative purposes only to explain the embodiment based on the concept of the present invention, and the embodiments based on the concept of the present invention may be carried out variously. Further, it will be understood that the descriptions is not intended to limit the present invention to the embodiments set forth herein but cover all modifications, equivalents and alternatives falling within the sprit and scope of the present invention.

Below, a method of forming a circuit according to the present invention will be described with reference to the accompanying drawings.

FIG. 2 is a flowchart showing a method of forming a circuit according to the present invention, and FIG. 3 is a schematic view of FIG. 2. As shown therein, the method of forming a circuit according to the present invention includes a seed-layer forming step S11 of preparing an electrically conductive seed layer 2; a pattern-groove forming step S12 of using a photocurable resin 3 to form a pattern groove 4 on the seed layer 2 so that the seed layer 2 can be exposed through the pattern groove 4 to form a circuit; a plating step S13 of filling a conductive material 5 in the pattern groove 4; a photocurable resin pattern-layer removing step S14 of removing the photocurable resin 3; and a seed-layer removing step S15 of removing the seed layer 2.

In the seed-layer forming step S11, the electrically conductive seed layer 2 including silver, a silver alloy or a silver compound is formed on a substrate material 1 by processes such as sputtering, chemical vapor deposition (CVD), electroless plating, coating, dipping, etc. Such a seed-layer forming process includes not only the foregoing processes but also any universal processes for forming a layer of metal, a metal alloy or a metal compound on the substrate material. In the pattern-groove forming step S12, the photocurable resin 3 on the prepared electrically conductive seed layer 2 is subjected to a lithography process, and thus the pattern groove 4 is formed to selectively expose the electrically conductive seed layer 2.

Therefore, the seed layer 2 is selectively exposed through the pattern groove 4 having a pattern desired to form a circuit, and a remaining portion of the seed layer 2 other than the circuit is protected by the photocurable resin 3.

Then, in the plating step S13, the pattern groove 4 is internally plated with and thus filled with the conductive material 5. In this case, the conductive material 5 may be copper of which electric conductivity is very high. In the plating step S13, the seed layer 2 exposed through the pattern groove 4 is used as an electrode so as to fill the conductive material 5 in the pattern groove 4.

Then, in the photocurable resin pattern-layer removing step S14, the photocurable resin 3 is removed. Not the conductive material 5 filled in the pattern groove 4 but only the photocurable resin 3 is removed, thereby leaving only the conductive material 5 patterned on the seed layer 2.

In the seed-layer removing step S15, the seed layer 2 is removed to thereby form the circuit having a desired pattern. To remove the seed layer 2, an etching solution capable of selectively etching only the seed layer made of silver, a silver alloy or a silver compound is employed. Because only the seed layer 2 is selectively etched, the circuit made of copper is not damaged.

In other words, the seed layer 2 is made of silver, a silver alloy or a silver compound, and the etching solution for selectively etching only such seed layer is used, so that a circuit board can be formed to have a fine pitch without damage during the seed-layer removing process, unlike a conventional case in which the circuit is damaged because the seed layer 2 made of copper, chrome or nickel and the conductive material 5 formed as the circuit and made of copper are etched together by the etching solution during a seed-layer removing process (see FIG. 5).

Further, as described above, the present invention relates to an etching solution composition for selectively etching only silver, a silver alloy or a silver compound.

The seed layer 2 refers to a thin film including silver, a silver alloy or a silver compound, and the seed-layer forming process may include sputtering, CVD, electroless plating, coating, and dipping processes, and any universal process capable of forming metal, a metal alloy, or a metal compound. However, there are no specific limits to the seed-layer forming process.

Below, a selective etching solution composition for silver, a silver alloy or a silver compound of the present invention will be described.

As the selective etching solution composition according to the present invention, there may be used an etching solution composition that contains an ammonium compound and an oxidizing agent, disclosed in Korean Patent No. 10-0712879 owned by the present applicant; or a selective etching solution composition that contains oxidative gas, peroxides, peroxy acid, or the like oxidizing agent, aliphatic amine or aromatic amine or alkanol amine or an ammonium compound, a chelate agent, defoamer, humectant, pH regulator and one or more other additives selected for improving etching performance of the etching solution, and water. Each composition of the selective etching solutions will be described below in detail.

The oxidizing agent contained in the etching solution composition for silver, a silver alloy or a silver compound serves to oxidize silver on the surface of the seed layer. The related art has disclosed the etching solution composition or the like using nitric acid, hydrochloric acid, sulfuric acid, phosphoric acid, iron nitrate, iron chloride, iron sulfate, iron phosphate, etc. However, such conventional etching solution compositions refer to materials for oxidizing and dissociating copper, nickel, chrome or the like metal, and are not suitable to be used as a circuit etching solution for selectively etching only silver.

The oxidizing agent includes air, oxygen, ozone or the like oxidative gas, sodium perborate, hydrogen peroxide, sodium bismuthate, sodium percarbonate, benzoyl peroxide, potassium peroxide, sodium peroxide or the like peroxides, formic acid, peroxyacetic acid, perbenzoic acid, 3-chloroperoxybenzoic acid, trimethylacetic acid or the like peroxy acid, and potassium persulfate. The oxidizing agent may be used mixing with at least one oxidizing agent.

With respect to the total weight of the etching solution composition of silver, a silver alloy or a silver compound, 1 to 30 wt %, more preferably, 3 to 18 wt % of oxidizing agent may be included. The oxidizing agent lower than 1 wt % makes etching speed be low and etching be incompletely performed, thereby producing a lot of silver residue. The silver residue may be present between a circuit and a circuit and cause a short-circuit, thereby causing a defective product. Further, productivity is adversely affected by the low etching speed. On the other hand, the oxidizing agent more than 30 wt % makes the exposed seed layer 2 be fast etched, but affects the seed layer 2 present under the circuit layer, thereby causing an excessive under-cut. Such an under-cut phenomenon has an adverse effect on the adhesion of the circuit layer, and thus needs to be suppressed.

Aliphatic amine or aromatic amine or alkanol amine or ammonium compound contained in the etching solution composition for silver, a silver alloy or a silver compound of the present invention serves to dissociate silver oxidized in the seed layer. By oxidation based on the oxidizing agent and dissociation based on aliphatic or aromatic amine, it is possible to selectively etch only silver, a silver alloy or a silver compound. As described above, nitric acid, hydrochloric acid, sulfuric acid, phosphoric acid, iron nitrate, iron hydrochloride, iron sulfate, iron phosphate, etc. included in the conventional etching solution composition cause both oxidation and dissociation because one material serves as a main etching agent to react with copper. However, in the etching solution according to the present invention, two materials are respectively in charge of the oxidation and the dissociation, and the aliphatic or aromatic amine or alkanol amine or the ammonium compound has a more violent dissociation reaction with oxidized silver than with copper, thereby selectively etching only the seed layer made of silver, a silver alloy or a silver compound.

The aliphatic or aromatic amine or alkanol amine or the ammonium compound may use ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethanolamine, 1-aminoethanol, 2-amino-2-methyl-1-propanol, ammonium carbonate, ammonium phosphate, ammonium nitrate, ammonium fluoride, ammonium hydroxide, or the like amines or ammonium compound. When such amines or ammonium compound is used, at least one of the amines or the ammonium compound may be mixed.

With respect to the total weight of the etching solution composition of the seed layer 2 made of silver, 1 to 75 wt %, more preferably, 20 to 70 wt % of aliphatic or aromatic amine or alkanol amine or the ammonium compound may be included. The aliphatic or aromatic amine or alkanol amine or the ammonium compound lower than 1 wt % makes a dissociation reaction with oxidized silver be inactive, thereby lowering the speed of etching the silver seed layer. On the other hand, the aliphatic or aromatic amine or alkanol amine or the ammonium compound more than 75 wt % has no problem in selectively etching the seed layer, but excessive use of the amines or the ammonium compound hinders the oxidizing agent in the etching solution from oxidizing silver, a sliver alloy or a silver compound and thus lowers the selective-etching speed. Therefore, the amines or the ammonium compound is used enough to cause a surface oxidation reaction of the seed layer and dissolve oxidized silver to make selective etching smooth.

The chelate agent, defoamer, humectant, pH regulator and one or more other additives selected for improving etching performance of the etching solution, which are included in the etching solution composition for silver, a silver alloy or a silver compound according to the present invention, serve to remove bubbles that may be generated in the oxidation reaction, give wetting properties so that the etching solution can be well absorbed onto the surface of the seed layer, and so on. Besides, general purpose additives may be selected and used to increase the effects of the present invention.

With respect to the total weight of the etching solution composition for the silver seed layer 2, each of the additives may be included by 0.1 to 10 wt %, more preferably, 1~7 wt % according to the kinds and purposes thereof. The additives less than 0.1 wt % cannot carry out their own roles of improving the effects of the present invention, i.e. the selective etching characteristic. The additives more than 10 wt % gelatinize (or gelate) the etching solution, thereby degrading the etching characteristics.

A remainder of a total 100 wt % etching solution composition for silver, a silver alloy or a silver compound according to the present invention except the foregoing materials is water. Deionized water may be used for this water.

INDUSTRIAL APPLICABILITY

According to the present invention, there is provided a method of forming a circuit, in which only silver, a silver alloy or a silver compound is selectively etched from a heterogeneous metal substrate material made of silver, a silver alloy or a silver compound and copper, thereby achieving a fine pitch.

Further, according to the present invention, there is provided an etching solution composition having a high etch factor, with which only silver, a silver alloy or a silver compound is selectively etched without damaging a copper circuit.

These make it possible to design a high-performance and highly-integrated circuit, and the circuit is variously applicable to a product required to be lightweight, thin, short and compact.

What is claimed is:

1. A method of forming a circuit by selectively etching an electrically conductive metal film seed layer, the method comprising:

a step (S11) of forming a seed layer with silver, a silver alloy or a silver compound on a substrate material by processes comprising sputtering, chemical vapor deposition (CVD), electroless plating, coating, and dipping;

a step (S12) of forming a pattern groove with a photocurable resin on the seed layer;

a step (S13) of forming a circuit by plating the pattern groove with copper by electroplating or electroless plating;

a step (S14) of exposing the seed layer by removing the photocurable resin; and a step (S15) of removing the exposed seed layer by a selective etching solution for selectively etching silver, a silver alloy or a silver compound, wherein the selective etching solution comprises 1 to 30 wt % of oxidizing agent, 20 to 70 wt % of amine compound, 0.1 to 10 wt % of additive, and a remaining wt % of water with respect to a total 100 wt % of the selective etching solution, wherein the amine compound comprises one or more selected from the group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol.

2. The method according to claim 1, wherein the additive comprises one or more selected from the group consisting of a chelate agent, an antifoaming agent, a wetting agent, and a pH regulator.

3. The method according to claim 1, wherein the oxidizing agent comprises one or more selected from the group consisting of oxidative gas, peroxides, peroxy acid, and potassium persulfate.

4. The method according to claim 3, wherein the oxidative gas comprises one or more selected from the group consisting of air, oxygen, and ozone;

the peroxide comprises one or more selected from the group consisting of sodium perborate, hydrogen peroxide, sodium bismuthate, sodium percarbonate, benzoyl peroxide, potassium peroxide, and sodium peroxide; and the peroxy acid comprises one or more selected from the group consisting of formic acid, peroxyacetic acid, perbenzoic acid, 3-chloroperoxybenzoic acid, and trimethylacetic acid.

* * * * *

UNITED STATES PATENT AND TRADEMARK OFFICE
CERTIFICATE OF CORRECTION

PATENT NO.         : 11,160,171 B2                          Page 1 of 1
APPLICATION NO.    : 16/485174
DATED              : October 26, 2021
INVENTOR(S)        : Kwang-Choon Chung et al.

It is certified that error appears in the above-identified patent and that said Letters Patent is hereby corrected as shown below:

On the Title Page

Item (73) Assignee:
"InkTee Co., Ltd."
Should be changed to:
-- InkTec Co., Ltd. --

Signed and Sealed this
First Day of March, 2022

Drew Hirshfeld
*Performing the Functions and Duties of the*
*Under Secretary of Commerce for Intellectual Property and*
*Director of the United States Patent and Trademark Office*